United States Patent
Wheeler et al.

(10) Patent No.: US 11,152,759 B2
(45) Date of Patent: Oct. 19, 2021

(54) HIGH TEMPERATURE OPTICAL MOLECULAR ANTI-CONTAMINATION GETTER SYSTEM

(71) Applicant: IPG Photonics Corporation, Oxford, MA (US)

(72) Inventors: Damon A. Wheeler, Santa Clara, CA (US); Thomas R. Myers, Palo Alto, CA (US); Mark W. Byer, Mountain View, CA (US); Jeffrey D. Kmetec, Palo Alto, CA (US); Brian R. Rankin, Palo Alto, CA (US); Cory Bowman, Los Gatos, CA (US)

(73) Assignee: IPG PHOTONICS CORPORATION, Oxford, MA (US)

(*) Notice: Subject to any disclaimer, the term of this patent is extended or adjusted under 35 U.S.C. 154(b) by 552 days.

(21) Appl. No.: 15/851,443

(22) Filed: Dec. 21, 2017

(65) Prior Publication Data
US 2018/0191129 A1    Jul. 5, 2018

Related U.S. Application Data

(60) Provisional application No. 62/440,215, filed on Dec. 29, 2016.

(51) Int. Cl.
| | |
|---|---|
| *B08B 7/00* | (2006.01) |
| *H01S 5/02235* | (2021.01) |
| *G02F 1/35* | (2006.01) |
| *B23K 26/00* | (2014.01) |
| *G02B 27/00* | (2006.01) |
| *G02B 5/00* | (2006.01) |
| *H01J 9/26* | (2006.01) |

(Continued)

(52) U.S. Cl.
CPC ........ *H01S 5/02235* (2021.01); *B08B 7/0071* (2013.01); *B23K 26/00* (2013.01); *G02B 5/003* (2013.01); *G02B 27/0006* (2013.01); *G02F 1/3501* (2013.01); *H01J 9/261* (2013.01); *H01J 29/94* (2013.01); *G02F 1/3505* (2021.01); *G02F 2201/50* (2013.01); *H01S 3/027* (2013.01)

(58) Field of Classification Search
None
See application file for complete search history.

(56) References Cited

U.S. PATENT DOCUMENTS

| | | |
|---|---|---|
| 4,119,403 A | 10/1978 | Rex |
| 5,207,505 A | 5/1993 | Naraki et al. |
| 7,346,867 B2 | 3/2008 | Su et al. |

(Continued)

FOREIGN PATENT DOCUMENTS

| | | | |
|---|---|---|---|
| JP | 59-188986 | * | 10/1984 |
| JP | 07-176821 | * | 7/1995 |

OTHER PUBLICATIONS

Computer Translation of JP07-176821 by Minemoto and Sonoda, published Jul. 14, 1995.*

(Continued)

*Primary Examiner* — Mikhail Kornakov
*Assistant Examiner* — Ryan L Coleman
(74) *Attorney, Agent, or Firm* — JDI Patent; Joshua Isenberg; Robert Pullman

(57) ABSTRACT

A heatable element is configured to apply sufficient energy density to contaminants in an internal ambient atmosphere with in a sealable housing to drive a reaction that inactivates the contaminants.

8 Claims, 8 Drawing Sheets

(51) Int. Cl.
*H01J 29/94* (2006.01)
*H01S 3/02* (2006.01)

(56) References Cited

U.S. PATENT DOCUMENTS

| | | | |
|---|---|---|---|
| 7,436,867 B2 | 10/2008 | McDonald et al. | |
| 9,031,110 B2 | 5/2015 | Murray et al. | |
| 9,205,376 B2 | 12/2015 | Fonseca | |
| 9,323,051 B2 | 4/2016 | Weiller et al. | |
| 2003/0155504 A1 | 8/2003 | Motchkine et al. | |
| 2003/0180030 A1 | 9/2003 | Hirose et al. | |
| 2004/0227102 A1* | 11/2004 | Kurt | G01N 21/95684 250/491.1 |
| 2010/0288302 A1* | 11/2010 | Ehm | B08B 5/02 134/1.1 |
| 2013/0021602 A1* | 1/2013 | Dribinski | H01S 3/11 356/237.3 |
| 2016/0203940 A1 | 7/2016 | Mizuo et al. | |
| 2017/0336282 A1* | 11/2017 | Kobayashi | G03F 7/70033 |

OTHER PUBLICATIONS

Translation of abstract of JP59-188986 by Takahashi, published Oct. 26, 1984.*
International Search Report and Written Opinion dated Nov. 16, 2018 for International Patent Application No. PCT/US2017/068017.
U.S. Appl. No. 62/440,215 to Damon A. Wheeler et al., filed Dec. 29, 2016.
Definition of "primarily" from Merriam-Webster Online Dictionary, downloaded from the Internet on Jun. 2, 2021, downloaded from.
Extended European Search Report dated Jul. 15, 2020 for European Patent Application No. EP3545350.
Office Action dated Mar. 2, 2021 for Russian Patent Application No. 2019120098.

* cited by examiner

FIG. 1A  FIG. 1B

HIGH TEMPERATURE OPTICAL MOLECULAR ANTI-CONTAMINATION GETTER SYSTEM

CLAIM OF PRIORITY

This application claims the priority benefit of U.S. Provisional Patent Application No. 62/440,215 filed Dec. 29, 2016, the entire contents of which are incorporated herein by reference for all purposes.

FIELD OF THE INVENTION

Embodiments of the present invention are related to removal of contaminants from optical component housings during operation of optical systems.

BACKGROUND OF THE INVENTION

During the operation of high powered optical systems, contaminated surfaces placed in the path of the radiation can absorb large amounts of energy and subsequently experience material changes due to absorption of laser light. For this reason it is vital that optical components within an optical system are kept clean and free from all contaminants. A contaminated critical optical surface in an optical system will reduce the performance of the system.

In order to maintain an optical system that is free from contaminants, modern lasers operate in sealed air-tight housings. These housings ensure that the dust and other contaminants in the air surrounding the optical system during operation do not affect the internal components of the laser. Nevertheless even within a sealed housing a laser system may experience a drop in performance due to dirtying of components within the system from air-born dust and contaminants present at the time of manufacture.

It is within this context that the current application is created.

BRIEF DESCRIPTION OF THE DRAWINGS

The teachings of the present disclosure can be readily understood by considering the following detailed description in conjunction with the accompanying drawings, in which:

FIG. 1A is a top-down view diagram of a heated wire getter according to an aspect of the present disclosure.

FIG. 1B is a side view diagram of a heated wire getter according to an aspect of the present disclosure.

SUMMARY OF THE DISCLOSURE

Figure 1C:
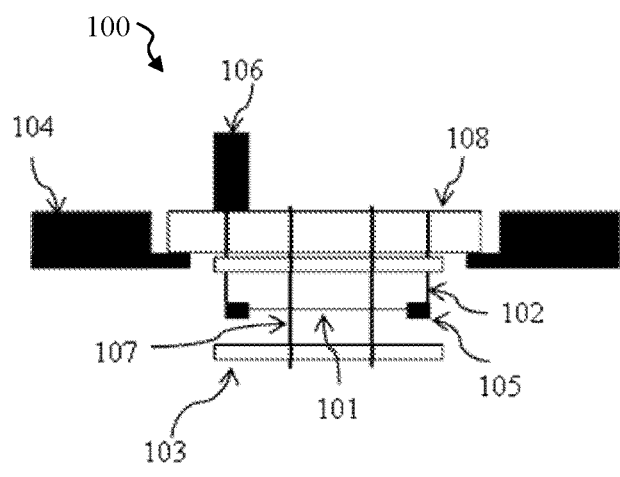
FIG. 1C is a top down plan view diagram of an optical system according to an aspect of the present disclosure showing the location for a heated wire getter.
Figure 1C:
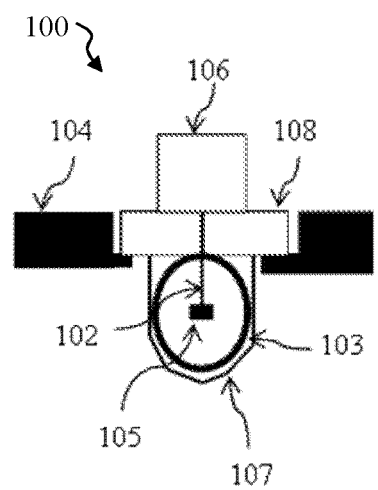
Figure 1C:
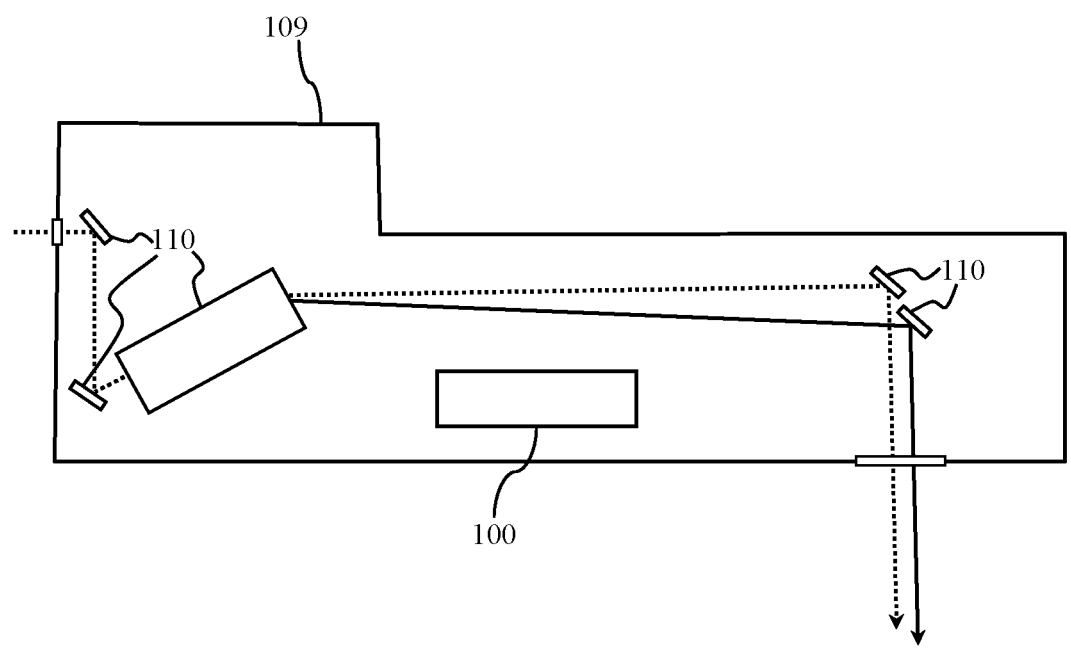

The disadvantages associated with the prior art are overcome by aspects of the present disclosure relating to creation of a catalytic getter system for use in an ambient atmosphere in a sealed housing. Disclosed embodiments include a first embodiment which uses a wire shaped heatable element heated by passing electricity through the heatable element to inactivate contaminants, e.g., by removing them from the ambient atmosphere in the housing or by decomposing the contaminants. A second disclosed embodiment includes a heatable element heated by radiation from the optical system.

DESCRIPTION OF THE SPECIFIC EMBODIMENTS

Although the following detailed description contains many specific details for the purposes of illustration, anyone of ordinary skill in the art will appreciate that many variations and alterations to the following details are within the scope of the invention. Accordingly, the exemplary embodiments of the invention described below are set forth without any loss of generality to, and without imposing limitations upon, the claimed invention.

In the following Detailed Description, reference is made to the accompanying drawings, which form a part hereof, and in which is shown by way of illustration specific embodiments in which the invention may be practiced. In this regard, directional terminology, such as "top," "bottom," "front," "back," "leading," "trailing," etc., is used with reference to the orientation of the figure(s) being described. Because components of embodiments of the present invention can be positioned in a number of different orientations, the directional terminology is used for purposes of illustration and is in no way limiting. It is to be understood that other embodiments may be utilized and structural or logical changes may be made without departing from the scope of the present invention. The following detailed description, therefore, is not to be taken in a limiting sense, and the scope of the present invention is defined by the appended claims.

Introduction

Modern lasers are manufactured in special clean rooms to reduce the amount of dust and other contaminants introduced in to the optical system as much as possible. Aside from contaminants introduced during manufacture, the components of the laser itself can produce gasses which are released in to the laser housing and which can be induced to react by the energy provided by the laser beam to contaminate and detrimentally affect the surfaces of the optical system. Optical components in high-powered laser systems (e.g., those with an optical output of about 1 watt or more) are especially susceptible to damage from contaminants in the air settling on optically reflective or transmissive surfaces and reacting with high powered laser light. As used herein, the term "light" generally refers to electromagnetic radiation in a range of frequencies running from infrared through the ultraviolet, roughly corresponding to a range of vacuum wavelengths from about 1 nanometer ($10^{-9}$ meters)

to about 100 microns. Shorter wavelength light is more energetic and therefore more likely to react with contaminants at lower power.

High powered light can burn or sufficiently photochemically alter materials on the surface of the optical components causing absorptive darkened spots, which can cause the equipment to fail. Additionally, evidence suggests that pulse format (therefore pulse energy) also is a factor in burn rate. For this reason the housing of optical systems are sealed from the outside air and produced in extremely clean conditions. Yet there may still be contaminants in the sealed housing produced as a result of manufacture of the system or impossible to get rid of with modern ventilation.

Examples of contaminants include but are not limited to the range of compounds such as: volatile organic compounds (VOCs) e.g. carbonaceous compounds, polymers and their monomer units, greases, organosilicons, oils, polishing compounds, and fluorohydrocarbons. Such contaminants are difficult to eliminate through clean manufacturing practices. One method that has been used by manufacturers to eliminate some forms of contaminants is by placing getters within the sealed laser housing.

Getters are reactive or sequestering materials typically used in the manufacture of vacuum tubes to absorb the gasses created by the heating and cooling of the components within the vacuum tube during operation. Getters in vacuum tubes were typically made of barium and flashed coated to the walls of the tube though other materials and types of getters have been used. The getter is slowly used up as it reacts to contaminants or sequesters contaminants off-gassed by the components of the vacuum tube during operation.

In the context of high powered lasers the concept of a getter is similar but the execution is different. Lasers are typically operated with the sealed housing at normal atmospheric pressure thus a reactive getter would not operate optimally because the housing is filled with air which would react with the getter. Manufacturers have used desiccant getter packets to remove moisture that is present during manufacture from the ambient atmosphere within the laser housing. These desiccant packets are not efficient at removing all contaminants, such as VOCs or larger molecules. Manufacturers have also used molecular sieves as a means of sequestering VOCs.

VOCs present a particular problem in the manufacture and operation of lasers. Contaminants of this class migrate to the surfaces of optical components and decompose to form oxides when hit with light of sufficient intensity and photon energy. These oxides then form a semi-transparent film/coating on the optical components of the optical system reducing output or impacting beam shape and causing permanent damage.

According to aspects of the present disclosure heatable element applies sufficient energy density to the contaminants in the enclosure to drive the reaction that takes the contaminants out of the internal ambient atmosphere. One way to do this is to heat up a surface that the contaminants impinge upon to a sufficient temperature to drive the reaction. Alternatively, the contaminants may be heated with radiation alone if the energy density of the radiation is sufficiently great and the contaminants are sufficiently absorptive of that radiation to drive the reaction.

Aspects of the present disclosure may be implemented, e.g., using a type of getter referred to herein as a catalytic getter. In such a getter, a hot surface of a heatable element is not in equilibrium. Instead, volatile contaminants are essentially destroyed in a reaction between contaminants and some other component of the ambient atmosphere (e.g., oxygen) at the hot surface. The catalyzed reaction forms non-volatile reaction products on the surface of the heatable element. If the optical enclosure is sufficiently well sealed, such a catalytic getter can potentially drive the partial pressure of contaminants to almost zero, which a desiccant getter cannot do.

There are a number of features of a catalytic getter that are important for it to operate as desired. For example, it is important for the optical enclosure in which it operates to be sealed and to contain an internal ambient atmosphere that includes some component that reacts with the contaminants when the getter is heated. One example of such a component is oxygen. Another important feature is to operate the catalytic getter at relatively high temperature compared to the other components within the enclosure. To ensure that the catalytic reaction preferentially takes place at the surface of the catalytic getter, it is desirable for the getter surface temperature to be higher than the warmest other component in the enclosure and certainly warmer than any of the optical components that are susceptible to the contaminants that react at the getter surface.

Another important feature is the choice of material for the catalytic getter. The getter material is preferably one that can be heated to a temperature sufficient to drive the catalytic reaction and that can also operate at that temperature for a long period of time compared to the period of operation of the optical components within the enclosure. Experiments by the inventors have shown that catalytic getter materials containing Nickel (Ni) or Chromium (Cr) or both can work fairly well.

In addition to important features there are some other useful features that are desirable in a catalytic getter as described herein. For example, it is useful, though not necessarily critical to have convective flow over the hot surface of the heatable element. Such convective flow enhances passive diffusion by drawing contaminant-laden ambient atmosphere toward the heatable element and away from contaminant-sensitive optical components.

Another useful feature for the catalytic getter is a high surface to volume ratio, in other words high roughness. The reason for this can be understood in terms of the nature of the catalytic reaction. In short, the catalytic reaction takes place at adsorption sites on the surface of the catalytic getter material. A rougher material has a greater surface area relative to the volume of the material and therefore has more adsorption sites.

In the interest of clarity, not all of the routine features of the implementations described herein are shown and described. It will be understood by those skilled in the art that in the development of any such implementations, numerous implementation-specific decisions must be made in order to achieve the developer's specific goals, such as compliance with application- and business-related constraints, and that these specific goals will vary from one implementation to another and from one developer to another. Moreover, it will be appreciated that such a development effort might be complex and time-consuming, but would nevertheless be a routine undertaking of engineering for those of ordinary skill in the art having the benefit of the present disclosure.

Hot Wire Catalytic Getter

FIG. 1A and FIG. 1B show a hot-wire implementation of a heatable element 100 according to an aspect of the present disclosure. In the present implementation, the heatable element 100 comprises a length of heating wire (101) connected at both ends to regular wires (102) the regular wires are connected to a power source (106) to create an electrical circuit. The catalytic wire is sheathed in a shield (103) with an air gap between the catalytic wire and the shield. The catalytic wire and shield is mounted to a surface within the sealed housing for optical components (104).

The length of heating wire (101) depends on the volume of the sealed housing. A longer catalytic wire will have a larger area to catalyze the decomposition of contaminants on its surface but an increase in length corresponds to an increase in the power dissipated as heat by the wire.

The material of the heating wire (101) can generally be any conductive material known in the art that, when heated catalyzes a reaction between components of an ambient atmosphere, e.g., oxygen, and contaminants, e.g., VOCs. Another desirable property of the wire (101) is resistance to oxidation. Once oxide starts forming on the wire additional current is typically necessary to maintain a desired temperature. Therefore, it is desirable for the wire (101) to be of a material with an oxidizing temperature well above the desired operating temperature for the gettering reaction. The gettering reaction decomposes or removes the contaminants from the ambient atmosphere, preferentially forming reaction products on the surface of the wire (101). It is desirable for the wire to have a high electrical resistivity, high melting point and be resistant to thermal fatigue as operation of the heatable element involves heating the wire with electrical current during operation and letting the wire cool when the system is not operating. Exemplary materials used for the catalytic wire without limitation include Nickel-Chromium alloys and stainless steels. By way of example, and not by way of limitation, 304 stainless steel is a good choice of material since it contains Nickel and Chromium, can withstand fairly high temperatures and is relatively inexpensive.

The heating wire (101) may be connected to lead wires (102) on both ends of the heating wire (101) such that electrical current is able to flow through the catalytic wire. The lead wires (102) may be made out of any conductive material; common materials include copper and aluminum. The heating wire (101) may be connected to the lead wires (102) through any electrically conductive means (105) for example, crimping, soldering, wire-wrapping or the like. The lead wires are preferably insulated with insulation that is tolerant of the elevated temperature to which the lead wires may be elevated due to their thermal connection to the heating wire (101). The power source (106) for the catalytic wire may be any source known in the art. The lead wires pass (102) through a portion of the housing and are supported, electrically and thermally isolated by ferrules (not shown) which surround a portion of each common wire and sit at the interface between the common wires and the housing. Materials used for ferrules comprise for example; ceramic, glass, plastic and the like.

The catalytic wire (101) is suspended through the length of the shield (103). The shield (103) may be a cylinder, half cylinder, rectangle, square or any shape that serves the purpose of protecting the other components inside the housing from the heat of the wire. The shield may be, formed, molded, cast or constructed from a plurality of panels or through similar means. The shield also serves to protect the components from contaminants discharged from the wire during catalysis of the decomposition reaction and reactants that are carried away by convection-induced airflow surrounding the wire. Materials that may be used for the shield (103) include but are not limited to, glass, ceramic, steel, aluminum and similar heat resistant materials. The shield may be secured to the housing by a rigid or flexible mount such as a metal or plastic mounting bracket, metal wire ties, plastic ties, bolts or the like (107). In the currently disclosed embodiment the heatable element and the shield are mounted on a printed circuit assembly (PCA) (108) for ease of assembly.

As seen in 1C the hot wire heatable element (100) may be mounted within a sealable optical system enclosure (109) remote from optical paths within the optical system but close enough to the system's optical components (110) to ensure that contaminant gasses are more likely to react with the heatable element and less likely to contaminate the optical components. The sealable enclosure (109) is configured to prevent intrusion of the ambient external atmosphere when sealed. When sealed, the enclosure (109) contains an internal ambient atmosphere that includes components that can react with the contaminants at the surface of the wire (101) when it is heated.

VOCs exist in the ambient air and are mostly harmless to humans. VOCs comprised of polymers are among the most common volatile organic compounds and are an additive to many personal care products. The optical component housing is sealed from the outside world to protect the optical components from any contaminants like VOCs that may be in the ambient air. Compounds in the air of the optical component housing cannot be filtered out by typical means because of the sealed natures of the housing. The optical component housing is generally sealed at standard room temperature (nominally 21° C.±15%) and standard pressure (nominally 1 atmosphere±15%). Similarly the composition of the air within the sealed optical component housing is standard dry air, ambient air composition (roughly 78% nitrogen 21% oxygen). The decomposition of VOCs is favorable at 450 degrees Celsius. Thus in the current disclosed embodiments the heatable element is heated to 450 degrees Celsius to decompose VOCs, the high temperature also has the effect of quickly boiling water off the surface of the heatable element allowing more area for the VOCs to interact with the hot heatable element further improving the decomposition. The heatable element also serves as the point the oxidized remnants of the reaction are collected. It should be noted that VOCs are only an illustrative example of contaminant that can negatively impact the function of an optical system. Other contaminant volatile organic compounds decompose at temperatures as low as 250 degrees Celsius. Additionally higher temperature operation may improve the speed of drying of the catalytic surface as well as the rate of reaction. Operating temperatures for heatable elements of 600 degrees Celsius or greater have been achieved. Thus it may be desirable to have a low temperature heatable element to decompose a selected contaminant at low power or a high temperature heatable element to improve reaction speed.

Hot Beam Dump Catalytic Getter

Figure 2:
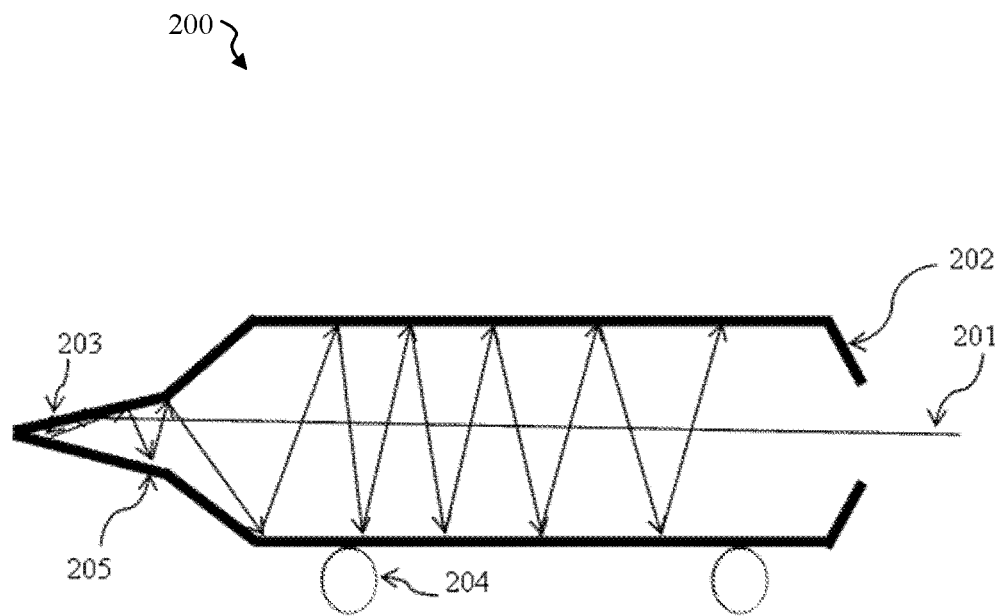
FIG. 2 is a top-down view diagram of a hot beam dump getter according to an aspect of the present disclosure.

Aspects of the present disclosure are not limited to implementations involving electrically heated catalytic wires. By way of example, and not by way of limitation, FIG. 2 shows another implementation of a heatable element 200 in accordance with aspects of the present disclosure. In this implementation radiation (201) is directed towards the catalytic surface to cause heating. Desirable features here include, but are not limited to, a surface capable of absorbing input radiation sufficiently enough to enact and achieve a desired steady-state temperature as a function of the incident (laser) power. The steady-state temperature that is achieved results from a design heat path. The absorption of incident power is achievable via mechanisms that may include: classical optical absorption driven by material selection, absorption enhanced by geometric/form factor considerations, and an overall resistance to oxidation or any material change that would affect the desired steady-state temperature. The catalytic surface is sheathed in a shield (not shown) to drive air over the heatable element through convection, protect the surrounding optical components and to trap any contaminants that may be discharged from the surface of the heatable element. The heatable element and the shield may be supported by a supporting wire or bracket (204) as discussed above. The catalytic surface may be shaped (203) to increase the heating efficiency of the radiation through reflection. When radiation is directed to the surface of a material a portion is reflected and a portion is absorbed depending on the angle and index of refraction of the material and the air thus increased reflections with the heatable element means that there will be an increased amount energy imparted into the heatable element from the radiation. A cone-shaped heatable element (203) that is enclosed (202) at the top increases the amount of reflected radiation (205) within the system. Each reflection (205) increases the amount of energy imparted into the surface of the heatable element from the light beam. A 70% efficient beam system for converting the incoming light to heat for the heatable element can be achieved with 25 reflections in the disclosed embodiment.

By way of experimental example, a beam dump was made by pinching one end of a length of copper tubing having an outside diameter of 6.3 mm, a length of 15 mm and a wall thickness of 0.75 mm. The beam dump was supported by two lengths of 0.06 inch diameter stainless steel wire. This beam dump required only about 30 Watts (about 0.0466 Watts per square millimeter ($W/mm^2$) of optical power to raise the temperature of the beam dump to 450 degrees Celsius.

By way of example, and not by way of limitation, 304 stainless steel is a good choice of material for a beam dump catalytic getter since it contains Nickel and Chromium, can withstand fairly high temperatures and is relatively inexpensive. The catalytic efficiency of such a material may be improved by forming the right kind of oxide layer on its surface. Flaky oxides are not good for a laser environment.

The right type of oxide can be formed through appropriate heat treatment of the beam dump material. Alternatively, one could chrome plate another material and then oxidize the chrome. There is an upper temperature for this type of oxide of around 700 C. In some implementations it might be possible to oxidize the catalytic getter in situ though by heating it with radiation (201). Other ways to increase the efficiency of a catalytic getter (hot wire or hot beam dump) include varying the surface finish, e.g., using carbon nanotubes to increase the surface area, roughening the surface of the heatable element and the like.

The radiation (201) may come as "waste light" that may be generated during generation of a final output beam (e.g., in a nonlinear optical frequency conversion), or as a sampling pickoff, and is therefore not typically considered part of the main output light of the system. To capture this light the embodiment of FIG. 2 may be placed behind a mirror that partially reflects the waste light out of the enclosure while allowing a portion of the waste light to reach the heatable element. Although the non-linear process that generates the radiation that heats the heatable element may take place within the enclosure 109 aspects of the present disclosure are not limited to such implementations. For example, a secondary sealed UV beam rounding snout may need a hot beam dump (from pickoff or waste reflected light). In this case, the non-linear process does not necessarily take place in the same sealed enclosure from which contaminants are to be inactivated.

Figure 3:
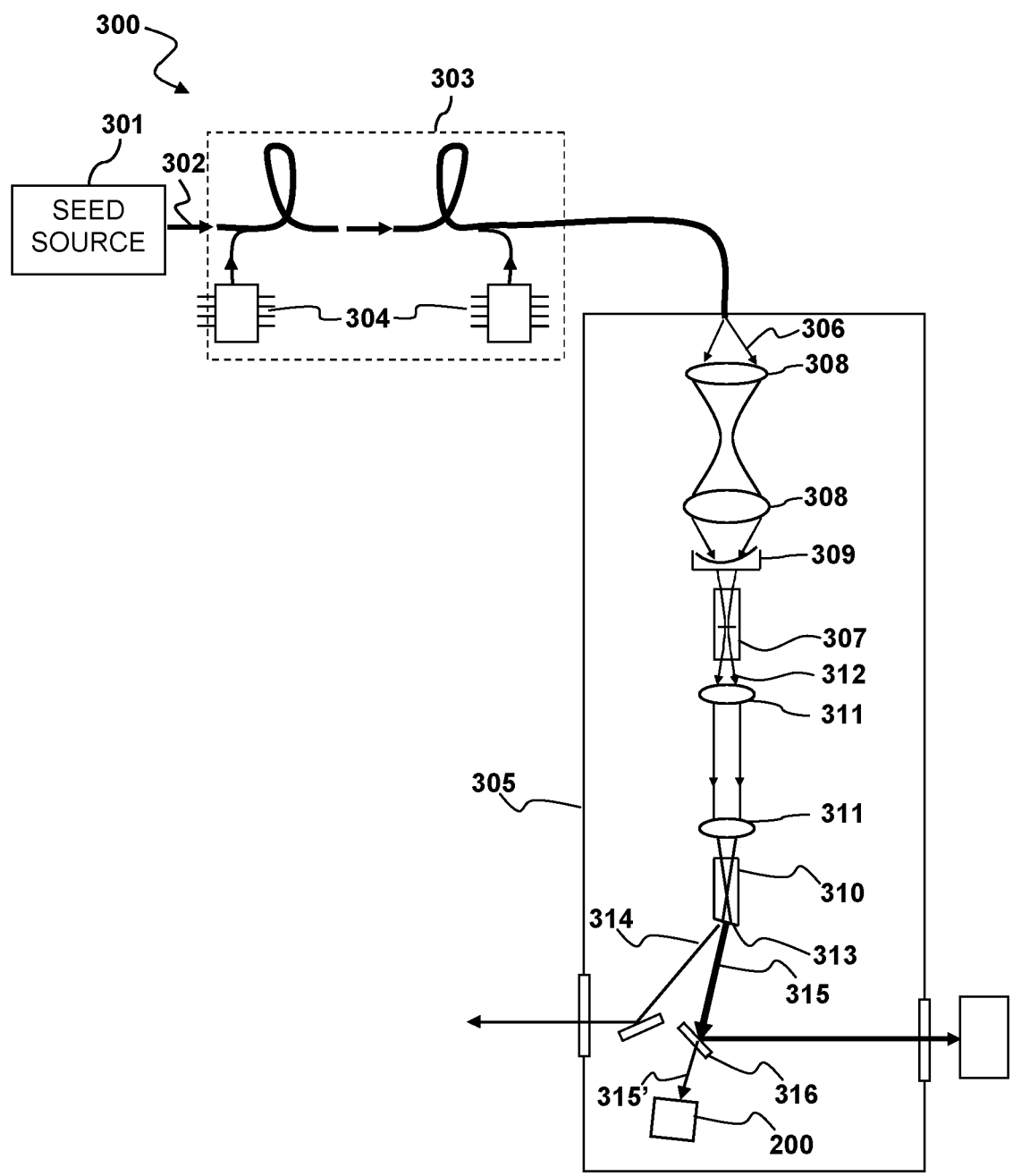
FIG. 3 is a schematic diagram of an optical system with non-linear optical elements and a hot beam dump getter according to an aspect of the present disclosure.

FIG. 3 schematically depicts an example of an optical system (300) that uses a hot beam dump heatable element (200) in accordance with an aspect of the present disclosure. The system generally includes a seed radiation source (301) that produces seed radiation (302). The seed radiation source may be a laser, e.g., a diode laser. Alternatively, the seed source 301 may be a diode-pumped solid state (DPSS) laser, which may be passively Q-switched, mode-locked or run continuous wave (CW) or quasi-CW. Other types of lasers may alternatively be used as the seed source 301. In the illustrated example, an optical amplifier (303) amplifies the seed radiation and the resulting amplified radiation is coupled to a non-linear optical conversion module in an enclosure (305). The optical amplifier may be, e.g., a fiber amplifier that includes a length of doped optical fiber that is pumped by pumping radiation from one or more pumping sources (e.g., diode lasers) (304). The resulting amplified radiation is coupled to the enclosure, e.g., via an optical fiber. The amplified radiation serves as input (306) to one or more non-linear optical elements (307, 310) in the enclosure (305).

The non-linear optical elements (307, 310) frequency convert the input radiation (306) to generate output radiation (314) of a desired optical frequency via a non-linear optical frequency conversion process. Typically, a portion of the input radiation (306) is not converted to the desired output radiation and this leftover input radiation may be regarded as waste light (315). In the illustrated example, optical elements, e.g., lenses (308, 309) couple input radiation (306) to a first non-linear optical element (307) that converts part of the input radiation (306) to intermediate radiation (312) at a higher frequency than the input radiation. Additional optical elements, e.g., lenses (311) couple the intermediate radiation to a second non-linear optical element (310), where further non-linear optical processes involving the intermediate radiation and (in some cases) some of the remaining input radiation generate the output radiation (314).

As used herein, the term non-linear optical process refers to a class of optical phenomena that can typically be viewed only with nearly monochromatic, directional beams of light, such as those produced by a laser. Higher harmonic generation (e.g., second-, third-, and fourth-harmonic generation), optical parametric oscillation, sum-frequency generation, difference-frequency generation, optical parametric amplification, and the stimulated Raman Effect are examples of non-linear effects.

Nonlinear Optical Wavelength Conversion Processes are non-linear optical processes whereby input light of a given vacuum wavelength $\lambda_0$ passing through a non-linear medium interacts with the medium and/or other light passing through the medium in a way that produces output light having a different vacuum wavelength than the input light. The term vacuum wavelength refers to the wavelength electromagnetic radiation of a given frequency would have if the radiation were propagating through a vacuum and is given by the speed of light in vacuum divided by the frequency. Nonlinear wavelength conversion is equivalent to nonlinear frequency conversion, since the two values are related by the vacuum speed of light. Both terms may be used interchangeably.

Examples of nonlinear optical wavelength (frequency) conversion processes include, but are not limited to, the following:

Higher Harmonic Generation (HHG), e.g., second harmonic generation (SHG), third harmonic generation (THG), fourth harmonic generation (FHG), etc., wherein two or more photons of input light interact in a way that produces an output light photon having a frequency $Nf_0$, where N is the number of photons that interact. For example, in SHG, N=2.

Sum Frequency Generation (SFG), wherein an input light photon of frequency $f_1$ interacts with another input light photon of frequency $f_2$ in a way that produces an output light photon having a frequency $f_1+f_2$.

Difference Frequency Generation (DFG), wherein an input light photon of frequency $f_1$ interacts with another input light photon of frequency $f_2$ in a way that produces an output light photon having a frequency $f_1-f_2$.

Examples of materials that may be used in the non-linear optical elements (307, 310) include, but are not limited to, crystalline materials, such as lithium niobate ($LiNbO_3$), lithium triborate (LBO), beta-barium borate (BBO), cesium lithium borate (CLBO), lithium tantalite, stoichiometric lithium tantalite (SLT) potassium titanyl phosphate ($KTiOPO_4$ also known as KTP), ammonium dihydrogen arsenate (ADA), ammonium dihydrogen phosphate (ADP), cesium triborate ($CsB_3O_5$ or CBO), deuterated ammonium dihydrogen arsenate (DADA), deuterated ammonium dihydrogen phosphate (DADP), deuterated arginine phosphate (DLAP), rubidium di-deuterium phosphate ($RbD_2PO_4$ or DRDP, potassium aluminum borate (KABO), potassium dihydrogen arsenate (KDA), potassium dihydrogen phosphate (KDP), deuterated potassium dihydrogen phosphate ($KD_2PO_4$ or DKDP), $L_iB_4O_7$ (LB4), or lithium formate monohydrate (LFM) and isomorphs thereof, periodically poled materials such as periodically poled lithium niobate (PPLN), periodically poled lithium tantalite and periodically poled stoichiometric lithium tantalite (PPSLT), and the like.

By way of example, and not by way of limitation, the first non-linear optical element (307) may be a second harmonic generation crystal that generates second harmonic radiation (312) from interactions involving the input radiation (306) and the non-linear optical crystal and the second non-linear optical element (310) may be a third harmonic generation crystal that generates third harmonic output radiation (314) through sum frequency interaction between the second harmonic radiation (312) and the unconverted input radiation (306) that is transmitted to the second non-linear optical element (310). The wavelength of the output radiation (314) for such a frequency-converted laser system may be selected according to the desired end-use application output wavelength(s). By way of example, and not by way of limitation, that wavelength may be between 200 nm and 6 µm.

Due to birefringence, the output radiation (314) and the waste light (315) exit the second non-linear optical element (310) at different angles. The output radiation (314) may be deflected, e.g., by a mirror, out of the enclosure (305), e.g., through a window. In some implementations, the bulk of the waste light (315) may be similarly deflected out of the enclosure through another window via a mirror (316). According to aspects of the present disclosure, the mirror (316) may be partially reflecting so that some of the waste light (315') may be transmitted through the mirror to the hot beam dump (200), which is situated behind the mirror and away from contamination sensitive optical elements within the enclosure (305). The transmitted portion (315') of the waste light heats the hot beam dump to a temperature sufficient for a catalytic reaction to take place at its surface. The catalytic reaction inactivates (e.g., removes or decomposes) contaminants that would otherwise damage or degrade sensitive optical elements such as the lenses (308, 309, 311), the mirrors, and the non-linear optical elements (307, 310) from the atmosphere in the enclosure. By way of example, and not by way of limitation, the catalytic reaction may decompose the contaminants into non-contaminating products or may render the contaminants non-volatile, e.g., by forming one or more non-volatile reaction products, thereby removing the contaminants from the internal ambient atmosphere. In some implementations, the catalytic reaction may form some non-contaminating reaction products from the contaminants and form some non-volatile reaction products from the contaminants.

Figure 4:
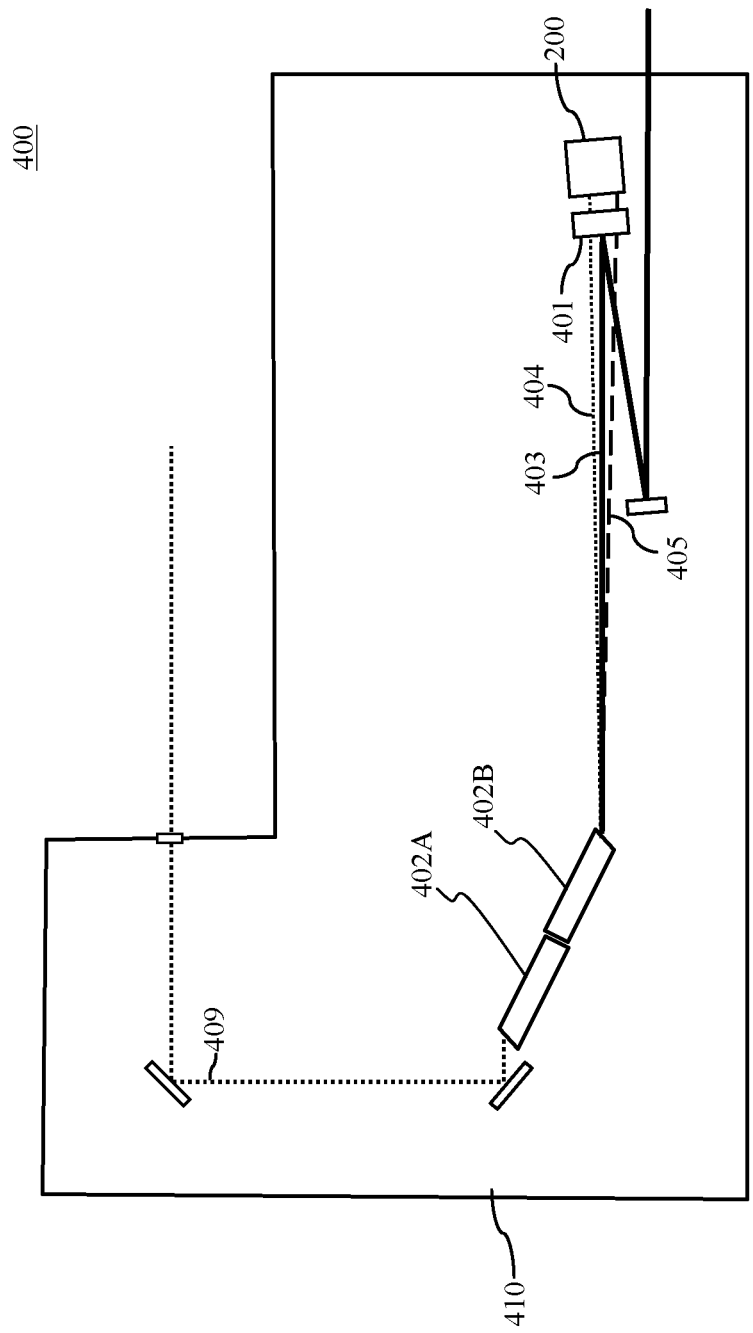
FIG. 4 shows a top down view of an optical system with placement of the hot beam dump getter according to an aspect of the present disclosure.

There are a number of configurations for implementing a system of the type illustrated in FIG. 3. FIG. 4 depicts on possible configuration of an optical system (400) As seen in FIG. 4, input radiation (409) a partially reflective mirror (401) is placed in the path of the beam leaving non-linear optical elements (402A, 402B) and the heatable element (200) is placed behind the mirror. The mirror reflects light having the wavelength of the desired output (403) and transmits (or partially transmits) waste light (404, 405) to the beam dump. The waste light is generated during the non-linear optical frequency conversion processes taking place in the non-linear optical elements (402A, 402B). By way of example, unconverted infrared input light (wavelength>700 nm) may be left over from a first non-linear optical element (402A) and infrared and green light (wavelength 495-570 nm), may be left over from the second non-linear optical element (402B). It should be noted that the wavelengths of the waste light depend on the input wavelength and the desired output wavelength which can be any wavelength but an illustrative range is between 200 nm and 6 µm.

The waste light is absorbed by the surface of the hot beam dump and the photonic energy is converted in to thermal energy. It may be necessary to tune the mirror (401) so that less waste light is passed to the hot beam dump to prevent overheating and failure. Thus materials chosen for the hot beam dump includes materials that are optically absorbing, have high optical damage threshold, high thermal damage threshold and materials that are in a fully or highly oxidized state. Materials that may be used in the currently disclosed embodiment, include, but are not limited to stainless steel of varying grades but preferably 304 or 316 grade, metallic copper, single crystal doped sapphire, sintered aluminum oxide alloys and black aluminum oxide coatings. One benefit of the currently disclosed embodiment is that it may be integrated with currently existing designs of lasers by replacing current beam dumps with the disclosed embodiment. Further benefits of the implementation shown in FIGS. 3-4 include smaller size, reduced complexity and no need for additional electrical components.

Figure 5A:
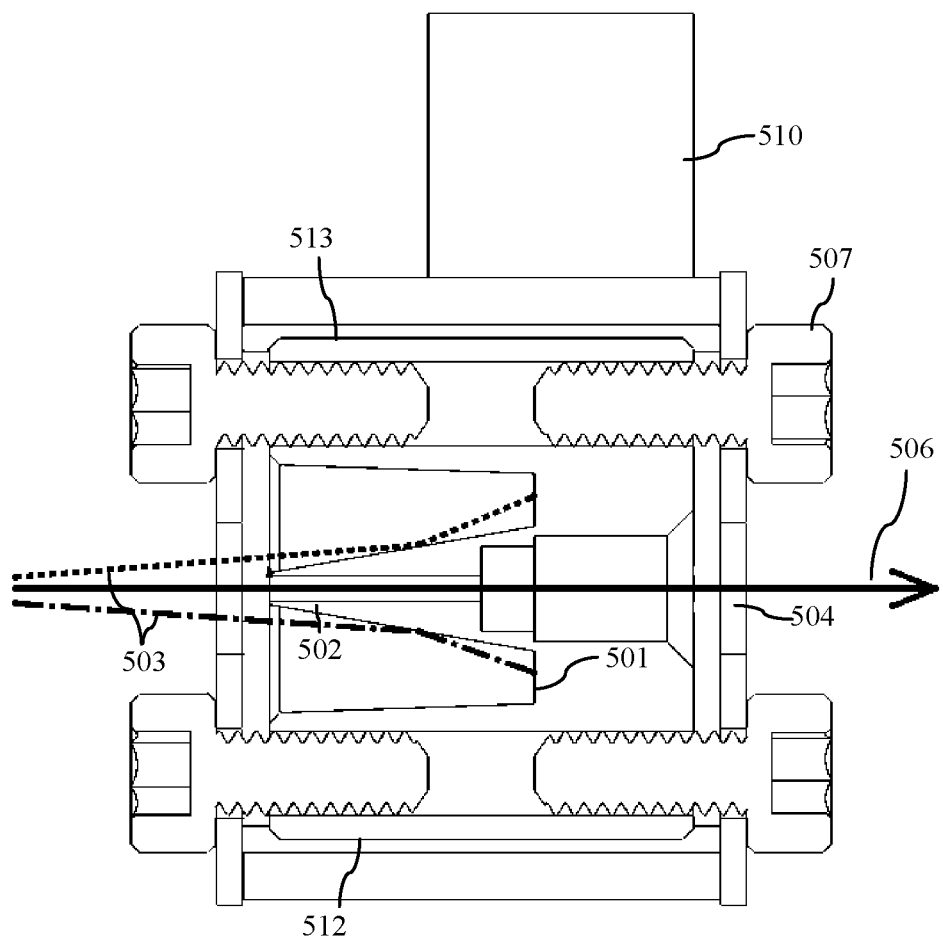
FIG. 5A is a top-down cut-away view diagram of the toroidal beam dump according to an aspect of the present disclosure.

FIG. 5A shows an alternative configuration for a hot beam dump type heatable element (500) in accordance with aspects of the present disclosure. In this implementation, the heatable element is formed in a toroidal shape with hollow walls (501) and a conical protrusion (502) in the center. The conical protrusion (502) is angled to deflect incoming waste light (503) towards the internal walls of the hollow toroid. The center hole (504) is lined up with the desired wavelength beam of the laser (505).

Figure 5B:
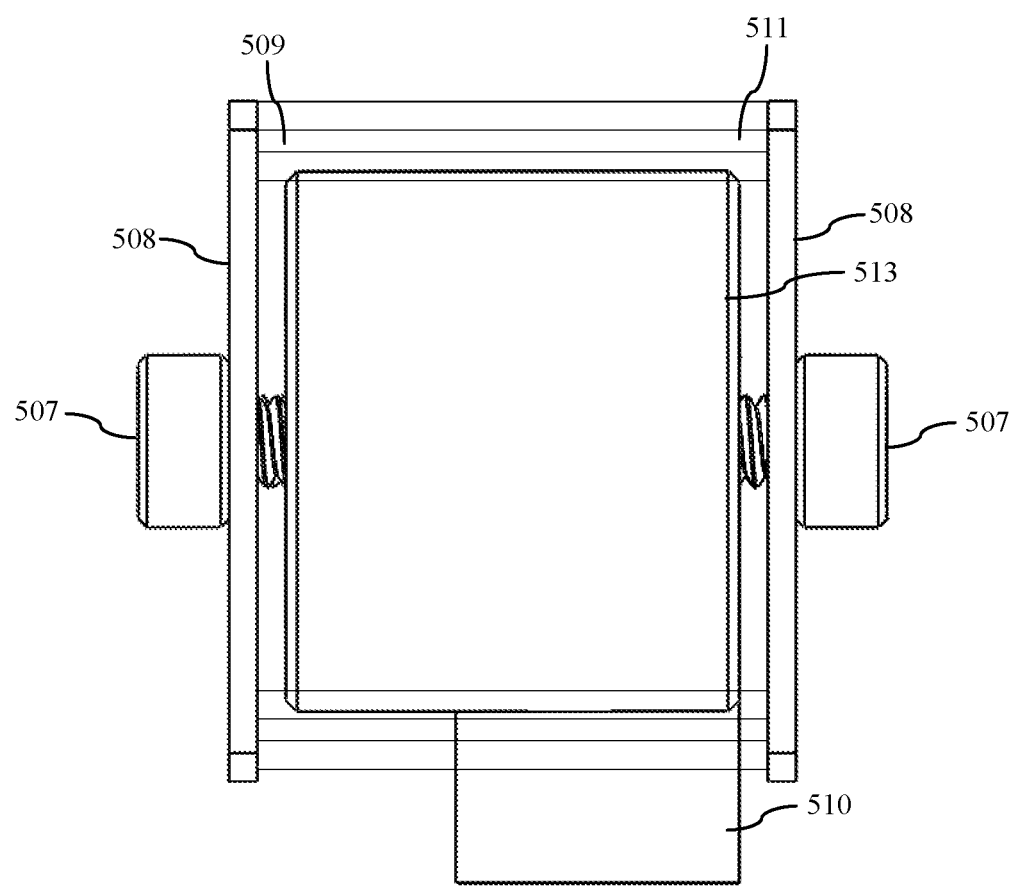
FIG. 5B is a side view of the exterior of the toroidal beam dump according to an aspect of the present disclosure.

FIG. 5B shows a side view of the beam dump illustrated in FIG. 5A. This embodiment is secured to the mounting bracket by 4 hex bolts (507) and 2 face plates (508) with central holes (504) and outer air gaps (509) separated by spacers (512). The sides of the mounting bracket (510) and faceplate assembly are clad with glass panels (511) to protect the optical components in the housing from the heat of the heatable element and from any contaminants that might be discharged from the surface of the heatable element (513) while in operation. The outer air gaps (509) serve to improve air flow around the body of the heatable element.

Figure 6:
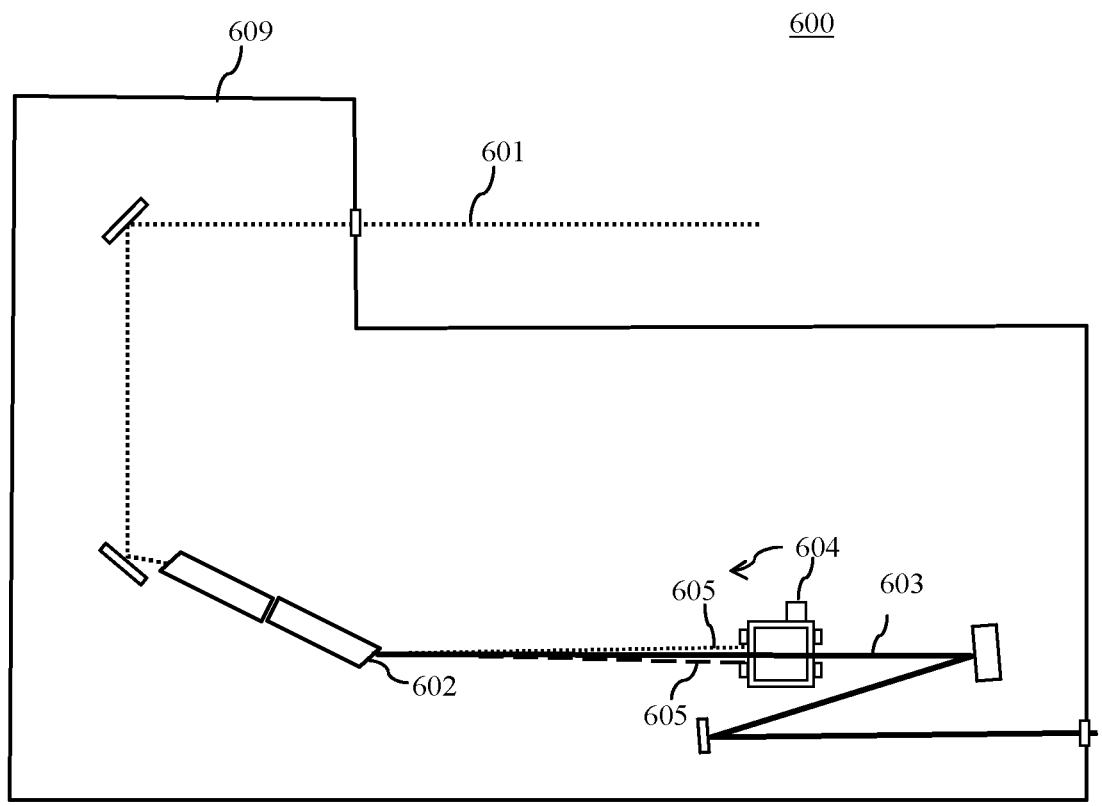
FIG. 6 shows a top down view of an optical system with placement of the toroidal hot beam dump getter according to an aspect of the present disclosure.

FIG. 6 shows a layout of an optical system (600) that incorporates a toroidal beam dump of the type shown in FIGS. 5A-5B in a sealable enclosure (609). The laser system (600) is designed such that different wavelengths of light generated from input light (601) are emitted from the optical amplifier as collimated beams at different angles. In this implementation, the beam dump (604) may be placed in line with the output of a wavelength converter (602) without the need for a mirror to selectively reflect the desired wavelength of light (603). Instead the waste light (605) is selectively absorbed in the dump based on the position of the beam dump (604) due to the effects of the angle at the output face of the non-linear optical elements which may be cut at Brewster's angle.

Figure 7:
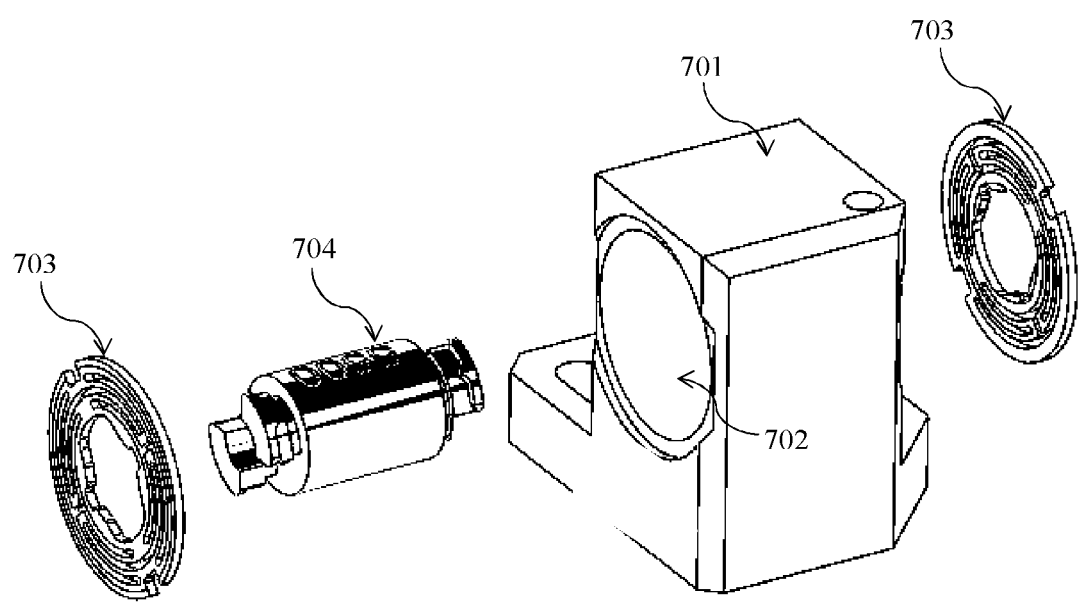
FIG. 7 shows an expanded view diagram of a hot beam dump according to an aspect of the present disclosure.

FIG. 7 shows an expanded view of an embodiment of the current disclosure. This embodiment presents an iteration of the hot beam dump disclosed in FIG. 2. Some additions include a gold plated aluminum mounting bracket (701) to reduce emissivity, integrated shielding with the mounting bracket (702), a vented gold plated mounting surface with flexure mounts for the catalyst (703) and a stainless steel catalyst (704).

While the above is a complete description of the preferred embodiments of the present invention, it is possible to use various alternatives, modifications, and equivalents. Therefore, the scope of the present invention should be determined not with reference to the above description but should, instead, be determined with reference to the appended claims, along with their full scope of equivalents. Any feature, whether preferred or not, may be combined with any other feature, whether preferred or not. In the claims that follow, the indefinite article "A" or "An" refers to a quantity of one or more of the item following the article, except where expressly stated otherwise. The appended claims are not to be interpreted as including means-plus-function limitations, unless such a limitation is explicitly recited in a given claim using the phrase "means for". Any element in a claim that does not explicitly state "means for" performing a specified function, is not to be interpreted as a "means" or "step" clause as specified in 35 USC § 112, ¶6.

What is claimed is:

1. A method for removing contaminants from an optical system comprising:
   applying sufficient energy density to contaminants in an internal ambient atmosphere in a sealed housing containing one or more optical components to drive a reaction involving the contaminants, wherein the reaction inactivates the contaminants, wherein the one or more optical components are susceptible to damage from the contaminants, wherein applying sufficient energy density to the contaminants in the internal ambient atmosphere in the sealed housing includes heating a heatable element, primarily with radiation, to a temperature that is higher than a temperature of the one or more optical components, and wherein the radiation is from one or more non-linear optical processes taking place in one or more solid non-linear optical elements.

2. The method of claim 1, wherein the internal ambient atmosphere includes oxygen, and wherein the reaction involving the contaminants is a reaction between the contaminants and another component of the internal ambient atmosphere.

3. The method of claim 1, wherein the reaction involving the contaminants takes place at a surface of the heatable element when the heatable element is heated, and wherein the reaction inactivates the contaminants by forming a reaction product.

4. The method of claim 1, wherein the heatable element is contained within a hollow shield inside the sealed housing, the hollow shield having an inside, an outside, and at least one opening leading from the outside to the inside.

5. The method of claim 1, wherein the one or more non-linear optical processes take place within the sealed housing.

6. The method of claim 1, wherein the radiation includes waste radiation from the one or more non-linear optical processes.

7. The method of claim 1, wherein the reaction inactivates the contaminants by removing the contaminants from the internal ambient atmosphere.

8. The method of claim 1, wherein the reaction inactivates the contaminants by decomposing the contaminants.

* * * * *